United States Patent Office 3,471,294

Patented Oct. 7, 1969

3,471,294

PHOTOSENSITIVE POLYVINYL BUTYRAL LACQUER CONTAINING WATER-INSOLUBLE CHROMATES OR BICHROMATES

Hendrikus Cornelis Nicolaas van der Sanden, Hendrikes Johannes Veenendaal, and Theo Tjalke Boersma, Emmasingel, Eindhoven, Netherlands, assignors, by mesne assignments, to U.S. Philips Corporation, New York, N.Y., a corporation of Delaware No Drawing. Filed Oct. 19, 1965, Ser. No. 498,144

Claims priority, application Netherlands, Oct. 20, 1964, 6412172

Int. Cl. G03c *1/66*

U.S. Cl. 96—93 6 Claims

ABSTRACT OF THE DISCLOSURE

Improved photosensitive polyvinyl butyral lacquers are prepared by employing light sensitive chromates or dichromates that are water insoluble but are soluble in the organic solvents in which the polyvinyl butyral resin is soluble. Such lacquers exhibit the advantage over lacquers in which water soluble chromates or dichromates are employed in preventing hardening of the resin in the unexposed areas, the so called "dark reaction."

The invention relates to a method of producing a photosensitive polyvinylbutyral lacquer consisting of a solution which contains a water-insoluble polyvinylbutyral resin and a dichromate or chromate.

Such lacquers are used, for example, in the photomechanical treatment of articles. By this treatment is understood a method in which the surface of a body is coated with a photosensitive lacquer layer which hardens when exposed to light, the lacquer layer is exposed through a template, the nonexposed parts of the layer are washed away and then material is removed from the released surface parts of the article or is provided on the said parts, after which, if required, the remaining parts of the lacquer layer are wholly or partly removed.

Such methods can be used, for example, in the manufacture of printing plates and for providing decorative coatings on articles. An important use also is the manufacture of printed wiring.

In addition these lacquers may be used in the manufacture of printing plates with a tanned image as printing layer.

The conventional photo-sensitive polyvinylbutyral lacquer is prepared by mixing a solution in an organic solvent of a water-insoluble polyvinylbutyral resin with small quantities of an aqueous solution of a sensibilizer, in this case an inorganic chromate or dichromate, for example, sodium-, potassium- or ammoniumchromate or -dichromate or mixtures of chromate and dichromate. The use of polyvinylbutyral resin as the base for a photosensitive lacquer has the advantage that on hardening at room temperature a lacquer layer is obtained with a greater chemical resistance and a better adherence to metals than when using a photo-sensitive lacquer on the base of polyvinyl alcohol and other materials used for this purpose, for example, fish glue, albumin, gum arabic and gelatine. The other materials must be burnt at comparatively high temperatures (200–400° C.) to obtain a lacquer layer with comparable chemical resistance. This generally required thermal treatment prevents the use of similar lacquers, inter alia in the photomechanical manufacture of printed wiring on carriers which are not resistant to the said thermal treatment.

In practice, however, the use of the aforementioned polyvinylbutyral lacquer appears to have several drawbacks.

The inorganic chromates and dichromates are only to a certain extent soluble in mixtures of organic solvents with water.

In the still wet lacquer provided on metal, in particular on copper, traces of metal dichromate are formed which strongly accelerate the dark reaction in the lacquer layer after drying. The result is that the non-exposed parts of the lacquer layer also often cannot be washed away or can be washed away only with difficulty.

It has been found that the physical and photochemical properties of the dried lacquer layer in the presence of inorganic chromates and dichromates depend upon the climatological conditions during drying.

It has been found that in the chemical or electrochemical treatment of the hardened lacquer layer said layer, in the presence of inorganic chromates and dichromates, often is porous and consequently cannot sufficiently exert its coating function.

A few of the said drawbacks can be avoided, for example, by passivating a metal surface to be treated and performing the provision of the lacquer and the exposure in a space with a low relative humidity (below 50%).

It is the object of the invention to mitigate the above described drawbacks.

According to the invention a lacquer is produced with an organic dichromate or chromate which is insoluble or substantially insoluble in water but is readily soluble in solvents in which the polyvinylbutyral resin is soluble.

According to the method of the invention lacquers can be obtained which are considerably better than was deemed possible so far. It has been found in practice that no metal dichromates are formed in lacquer layers provided on metal and particularly on copper as a result of which the dark reaction proceeds far more slowly than in lacquer layers which contain inorganic chromates or dichromates.

Also the physical and photo-chemical properties of the lacquer layers obtained with the lacquer according to the invention are influenced to a lesser extent by climatological conditions during drying.

Finally it has been found that in the presence of organic water-insoluble dichromates or chromates lacquer layers are formed which are not porous or are porous to a far lesser extent.

In the preparation of the photo-sensitive lacquer according to the invention polyvinylbutyral resins may be used with a vinyl alcohol content between 5 and 60% by weight or more and a viscosity measured according to Höppler in a 10% by weight solution in 95% ethanol between 20 and $10^3$ cp. In general these are polyvinylbutyral resins with an average molecular weight between 20,000 and 150,000. Preferably resins are used with a vinyl alcohol content of 12 to 25% by weight since with the use of such resins optimum lacquers are obtained as regards the photo-sensitivity.

The lacquers according to the invention can be prepared, for example, with solvents, such as alcohols, for example, methanol, ethanol, monoethylglycolether, dimethylformamide; ketones, for example, methyl isobutyl ketone, methyl ethyl ketone; esters, for example butyl acetate.

The use of water-soluble organic chromates and dichromates, in combination with natural colloid formers, for example, fish glue, gelatine and albumin, is known. These are compounds derived from pyridine, urea or methylamine. The photosensitivity of these compounds in general is somewhat larger than that of the inorganic chromates and dichromates. However, in combination with a polyvinylbutyral resin a lacquer is obtained which has the same drawbacks, connected with the solubility in water of the said substances, as a similar lacquer composed with an inorganic chromate or dichromate.

The organic dichromates and chromates which are used in the preparation of photo-sensitive lacquers according to the invention in many cases also show a greater photo-sensitivity than inorganic chromates and dichromates while the dark reaction in the dried lacquer layer proceeds far less slowly than in the said water-soluble organic chromates and dichromates. When using these latter compounds it is sometimes recommended in connection therewith to use a stabilizer. This is not a necessity with the lacquers prepared according to the invention. The organic dichromates in general are more photo-sensitive than organic chromates. Therefore the dichromates are preferably used in the preparation of the lacquers according to the invention.

The method according to the invention in principle has the advantage that a sparingly-water-soluble or non-water-soluble organic dichromate or chromate can be used which has a great solubility in the organic solvent to be used in the preparation of the lacquer.

Examples of organic dichromates which are preferably used in the preparation of a photo-sensitive lacquer according to the invention are the dichromates of primary, secondary and tertiary amines with at least 8, 5 and 3 carbon atoms respectively per carbon chain occurring in the molecule and the quaternary ammonium salts having at least one longer aliphatic carbon chain which contains at least 8 carbon atoms and, if several longer carbon chains are present, at least 6 carbon atoms per carbon chain.

To this group of compounds belong, for example, the following compounds which have been found usable within the scope of the invention:

n-octylammoniumdichromate,
n-decylammoniumdichromate,
diamylammoniumdichromate,
dioctylammoniumchromate,
tripropylammoniumdichromate,
triisoamylammoniumdichromate,
tributylammoniumdichromate,
polyxethylene decylammoniumdichromate.

Water-insoluble dichroates can also be prepared from a number of organic dyes with a cationic character.

Examples thereof are among others methylene blue BB sofranine extra, acriflavine, quinoline blue.

The organic dichromates described can be obtained, for example, by converting aqueous solutions of the amines in acid medium with an aqueous solution of an alkali dichromate.

On closer inventigation within the scope of the invention it has been found that the use of quaternary ammonium dichromates in the preparation of the lacquers according to the invention is to be preferred. With these compounds the thermally most stable lacquers are obtained, that is to say, lacquers with the longest pot-life. In other respect also additional advantages are found when using the said compounds.

These compounds belong to the following groups: trimethylalkylammoniumdichromate $[RN(CH_3)_3]_2Cr_2O_7$ dimethyldialkylammoniumdichromate $$[R_1R_2N(CH_3)_2]_2Cr_2O_7$$

methyltrialkylammoniumdichromate $$[R_1R_2R_3NCH_3]_2Cr_2O_7$$

tetra-n-alkylammoniumdichromate $$[R_1R_2R_3R_4N]_2Cr_2O_7$$

alkylpyridiniumdichromate $[RNC_5H_5]_2Cr_2O_7$ wherein R, $R_1$, $R_2$, $R_3$, $R_4$ consist of aliphatic saturated and unsaturated carbon chains with from 6 to 18 carbon atoms or alicyclic rings and wherein $R_1$, $R_2$, $R_3$ and $R_4$ may be either different or identical.

The degree of suitability of the compounds belonging to these groups, the quantities to be used and the optimum chain lengths of the alkyl groups are naturally determined by empirical factors, the photosensitivity in combination with polyvinylbutyral resin, the solubility in water and certain organic solvents.

In accordance with the type of the said compounds the optimum chain length must be set at minimally 6–8 carbon atoms and maximally 12–18 carbon atoms in accordance with the number of chains and the length thereof. In the case of shorter chain lengths the solubility in water becomes too large and the thermal reducibility (dark reaction) increases and the stability of the lacquers prepared with such organic dichromates decreases. In the case of longer chain lengths the solubility in organic solvents becomes small and the photochemical reducibility and therewith the photo-sensitivity of the lacquers prepared with such organic dichromates decreases.

A few of the described types of organic quarternary ammonium dichromates show a greater photo-sensitivity than the other types, in particular the dimethyldialkylammonium dichromates with chain lengths between 8 and 12 carbon atoms, and further trimethyllauroylammonium dichromate. The solubility of the said compounds in the above mentioned organic solvents is such that the dose of chromium can be chosen to be, for example, two times as high as when using sodium dichromate.

The solutions of the quaternary ammonium dichromates in the polyvinylbutyral lacquer are neutral and it has been found that substantially no copper compounds occur in the dried lacquer layer when applied to copper. Consequently the dark reaction is considerably more slowly than in lacquers in which inorganic dichromates occurs.

As examples of quaternary ammonium compounds which have been found useful in lacquers according to the invention may be mentioned among others:

trimethyllauroylammoniumdichromate,
trimethylcetylammoniumdichromate,
dimethylcetylstearylammoniumdichromate,
dimethyllauroylammoniumdichromate,
stearylimidopropyldimethyl-β-hydroxyethylammonium-dichromate,
tetra-n-hexylammoniumdichromate,
lauroylpyridiniumdichromate,
myristylammoniumdichromate,
cetylpyridiniumdichromate,
stearylpyridiniumdichromate,
stearylimidomethylpyridiniumdichromate, and dichromates of the quaternary ammonium compounds derived from coco-oil, and soya-bean oil, hydrogenated tall oil.

In order that the invention may readily be carried into effect, it will now be described in greater detail with reference to the following specific examples:

EXAMPLE 1

3 g. of trimethyl-n-lauroylammonium dichromate are added to a solution of 13.5 g. of polyvinylbutyral (vinyl alcohol content approximately 20% by weight, viscosity of a standard solution of 10% by weight of polyvinylbutyral in 95% ethanol: 120 cp. at 25° C.) in 60 ml. of dimethylformamide and 100 ml. of butanone. After the complete dissolution of the dichromate a previously rinsed copper plate is dipped in this solution in a manner such that after drying in air of 40° C. an even thin lacquer layer (3–4 microns) is obtained. This layer is exposed to light through a template for 1 minute by means of four 125 watt high-pressure mercury lamps arranged in the corners of a square with sides of 15 cm. at a distance of 50 cm. from the object. The unexposed parts of the layer are then washed away in methanol. The remaining resist pattern is useful as a screening layer for various etching operations or electro-deposition treatments.

EXAMPLE 2

1 g. of tetra-n-hexylammonium dichromate is added to a solution of 15 g. of polyvinylbutyral (vinylalcohol content 13% by weight, viscosity of a solution of 10% by weight polyvinylbutyral in 95% ethanol: 175 cp. at 25° C.) in 80 ml. of dimethylformamide and 80 ml. of butyl acetate. After the complete dissolution of the dichromate a sheet of hard paper on which a copper foil is glued with a thickness of, for example, 35 microns is dipped in the lacquer solution in a manner such that after drying in air of 40° C. an even thin lacquer (3–4 microns) is obtained on the copper. The lacquer layer is covered with a template representing the pattern of a printed circuit and exposed to the light for one minute by means of a high pressure mercury lamp of 2000 watt at a distance of 1 m. from the object. The unexposed parts of the lacquer are dissolved in monoethylglycol ether, the sheet is rinsed in water and then the copper which is not coated with laquer is etched away up to the hard paper carrier by means of an aqueous ferric chloride solution having a strength of 30° Baumé. Now a printed electric circuit is obtained which corresponds to the template.

EXAMPLE 3

1 g. of lauroylpyridinium dichromate is added to a solution of 13.5 g. of polyvinylbutyral (vinylalcohol content 22% by weight, viscosity of a solution of 10% by weight polyvinylbutyral in 95% ethanol: 400 cp. at 25° C.) in 100 ml. of methanol and 60 ml. of monoethylglycolether. After complete dissolution of the dichromate a sheet of hard paper on which a copper foil with a thickness of, for example, 35 microns is glued, is dipped in the lacquer solution in a manner such that after drying in air 40° C. an even this lacquer layer of 3–4 microns is obtained on the copper.

The lacquer layer is covered with a template representing the pattern of a printed circuit and exposed to light by means of a high pressure mercury lamp of 2000 watt arranged at a distance of 1 m. from the object. The unexposed parts of the lacquer are dissolved in methanol, the sheet is rinsed in ethyl acetate and dried. Then a galvanic lead-tin layer is deposited on the copper which is not coated with lacquer. The remaining lacquer is removed chemically and the copper which is not coated by the lead-tin alloy is etched away up to the hard paper carrier in an aqueous solution of chromic acid and sulphuric acid. In this manner a solderable printed electric circuit has been obtained.

The term "dark reaction" wherever employed in the foregoing is meant to indicate a hardening reaction occurring in unexposed areas of the polyvinylbutyral lacquer layers. As a result of this reaction, thin films of insoluble lacquer may remain on areas where they have to be washed away (to be "developed"). This phenomenon is generally known as scum-formation. The presence of scum implies for example poor etching or plating, and in extreme cases prevents them at all.

It is mentioned that with some of the organic dichromate compounds the solubility is such that the chromium dose can be chosen to be two times as high as when using sodium dichromate in general however the same amount of chromium is optional. This amount expressed in $Cr_2O_3$ is 5% by weight of the amount of polyvinyl butyral resin, although amounts as low as 1% by weight or as high as 10% by weight may be usable.

What is claimed is:

1. A photosensitive polyvinyl butyral lacquer comprising an organic solution of a water-insoluble polyvinyl butyral resin and an essentially water insoluble organic dichromate selected from the group consisting of the dichromates of monoalkyl amines containing at least 8 carbon atoms per carbon chain, dichromates of dialkyl amines containing at least 5 carbon atoms per carbon chain and dichromates of trialkyl amines containing at least 3 carbon atoms per carbon chain, quaternary ammonium dichromates containing one alkyl group of 8–18 carbon atoms and three methyl groups, quaternary ammonium dichromates containing at least two alkyl groups of 6–18 carbon atoms each and wherein any remaining N-alkyl groups are methyl groups, monoalkyl pyridine dichromates containing from 16 to 18 carbon atoms in the alkyl group and water insoluble dichromates of cationic organic dyes.

2. The photosensitive lacquer of claim 1 wherein the organic dichromate is an alkyl substituted quaternary ammonium dichromate.

3. The photosensitive lacquer of claim 2 wherein the organic dichromate is a dimethyldialkyl ammonium dichromate.

4. The photosensitive lacquer of claim 3 wherein the organic dichromate is trimethyl n-laurylammonium dichromate.

5. The photosensitive lacquer of claim 3 wherein the organic dichromate is tetra-n-hexylammonium dichromate.

6. The photosensitive lacquer of claim 3 wherein the organic dichromate is laurylpyridinium dichromate.

References Cited

UNITED STATES PATENTS

| | | | |
|---|---|---|---|
| 2,025,996 | 12/1935 | Maillet | 96—93 |
| 2,819,164 | 1/1958 | Boersma | 96—93 |

FOREIGN PATENTS

| | | |
|---|---|---|
| 6,500,753 | 7/1965 | Netherlands. |

OTHER REFERENCES

Jorgensen, G. W. "The Sensitivity of Bichromate Colloids," Photographic Engineering, vol. 7, No. 1, 1956, p. 16 (96/93).

Kosav, J., Light-Sensitive Systems, 1965, pp. 92–3.

Lucas, H. J., Organic Chemistry, 1935, pp. 277, 279, 283.

NORMAN G. TORCHIN, Primary Examiner

CAROLYN E. DAVIS, Assistant Examiner

U.S. Cl. X.R.

96—36, 36.2, 75